(12) United States Patent
Derflinger

(10) Patent No.: US 7,718,043 B2
(45) Date of Patent: May 18, 2010

(54) MULTILAYER HARD COATING FOR TOOLS

(75) Inventor: Volker Derflinger, Feldkirch (AT)

(73) Assignee: Oelikon Trading AG, Trubbach (CH)

( * ) Notice: Subject to any disclaimer, the term of this patent is extended or adjusted under 35 U.S.C. 154(b) by 0 days.

(21) Appl. No.: 12/570,392

(22) Filed: Sep. 30, 2009

(65) Prior Publication Data

US 2010/0012483 A1 Jan. 21, 2010

Related U.S. Application Data

(63) Continuation of application No. 12/027,534, filed on Feb. 7, 2008, now Pat. No. 7,618,720, which is a continuation of application No. 11/178,818, filed on Jul. 11, 2005, now Pat. No. 7,348,074.

(30) Foreign Application Priority Data

Apr. 1, 2005 (CH) .................................. 0059805

(51) Int. Cl.
C23C 14/00 (2006.01)
(52) U.S. Cl. ............................. 204/192.12; 204/192.15; 204/192.16; 204/192.38
(58) Field of Classification Search ............ 204/192.12, 204/192.15, 192.16, 192.38
See application file for complete search history.

(56) References Cited

U.S. PATENT DOCUMENTS 6,274,257 B1   8/2001   Aharonov et al.

| 6,586,122 | B2 | 7/2003 | Ishikawa et al. |
| 6,790,543 | B2 | 9/2004 | Kubola et al. |
| 6,827,976 | B2 | 12/2004 | Derflinger et al. |
| 7,348,074 | B2 | 3/2008 | Derflinger et al. |

FOREIGN PATENT DOCUMENTS

| CA | 2523882 A2 | 7/2004 |
| EP | 1174528 A2 | 1/2002 |
| EP | 1219723 A2 | 7/2002 |
| EP | 1422311 A2 | 5/2004 |
| JP | 06-322517 A | 11/1994 |
| JP | 09-041127 A | 2/1997 |
| JP | 10-025566 A | 1/1998 |

OTHER PUBLICATIONS

International Search Report for Application PCT/CH2006/000177, dated Oct. 11, 2007.
Written Opinion for PCT/CH2006/000177, dated Oct. 11, 2007.

*Primary Examiner*—Archene Turner
(74) *Attorney, Agent, or Firm*—Pearne & Gordon LLP

(57) ABSTRACT

A multilayer hard coating for tools for machining applications with a multilayer structure for improving the wear resistance of workpieces includes at least one $(Al_yCr_{1-y})X$ layer ($0.2 \leq y \leq 0.7$), wherein X is one of the following elements N, C, B, CN, BN, CBN, NO, CO, BO, CNO, BNO, CBNO, but preferably N or CN, and/or a $(Ti_zSi_{1-z})$ layer ($0.99 \geq z \geq 0.7$). The hard coating also includes at least one layer stack with one (AlCrTiSi) X mixed layer, followed by another $(Ti_zSi_{1-z})X$ layer, followed by another (AlCrTiSi) X mixed layer, followed by another $(Al_yCr_{1-y})X$ layer.

24 Claims, 2 Drawing Sheets

MULTILAYER HARD COATING FOR TOOLS

TECHNICAL FIELD

This invention concerns a multilayer hard coating for tools (hard metal and high-speed steel) for machining applications—especially drilling applications.

1a) Tools coated with hard coatings, with a series of several different aluminum chromium nitride or carbonitride and titanium silicide nitride or carbonitride layers 1b) Tools, especially cutting and forming tools (drills, millers, taps, formers, roller cutters, stamps, dies, drawing stamps, etc.) with a series of several different aluminum chromium nitride or carbonitride and titanium silicon nitride or carbonitride layers and the use of such tools 1c) A method of producing a series of several different aluminum chromium nitride or carbonitride and titanium silicon nitride or carbonitride layers with a defined layer structure.

STATE OF THE ART

EP 1174528 A2 describes a tool coating comprised of a series of several individual layers, wherein the first layer is composed of a nitride, carbide, carbonitride, boride, oxide, etc. of the elements Ti, Al and/or Cr, and a second layer is composed of a nitride, carbide, carbonitride, boride, oxide etc. of Si and at least one element from groups 4a, 5a and 6a of the PTE [Periodic Table of the Elements]. The advantage of this coating is that the Si in the upper layer critically improves the wear resistance and oxidation resistance. The Cr—Si-based cover layers mainly improved tool life. TiAlN, CrAlN and TiN layers are chosen for the bottom layer.

EP 1422311 A2 describes Al—Cr—(Si)—O-based hard layers that can be made as nitrides, carbide, oxide, boride, etc. For all layers, it is true that a small percentage of oxygen (1-25%) is contained in the layers. It should also be mentioned that another hard layer can be applied in the coating mentioned in the invention. Ti—Si—N Ti—B—N, BN, Cr—Si—N, etc., inter alia, are given here as examples. One advantage of the invention is the use of small quantities of oxygen or silicon and oxygen, since this results in greater hardness, improved wear resistance and high-temperature oxidation resistance.

EP 1219723 A2 introduces a Ti—Al—Cr—X-N-based coating, where X can stand for Si, B and/or C. The advantage of this coating is to improve wear-resistance compared to conventional coatings. The invention also describes a target that must be composed of at least Ti, Al and Cr.

DISADVANTAGES OF THE STATE OF THE ART

The tools with hard coatings in the state of the art (Ti—Al—N-based coatings) have shorter tool lives than the new optimized $(Al_{1-x}Cr_xX)$—$Ti_{1-y}Si_y$) X-hard coatings for X=N or CN.

The disadvantages of the state of the art are also that with Al—Cr—N coatings at high temperatures in an atmosphere of inert gas (for example, an argon atmosphere), the coating starts to decompose at around 900° C. If this heat-treatment process is carried out in an atmosphere of oxygen, the decomposition process goes into a higher temperature range. Now, if a continual cut is being considered in machining, the local temperatures are very high (sometimes over 1000° C.) in the contact area between the surface of the tool and the workpiece. If this contact surface is large enough so that no/little oxygen can have a stabilizing effect on the coating surface, the cubic CrN breaks down into hexagonal $Cr_2N$ and then at a higher temperature into metallic Cr. This coating decomposition process results in premature wear on the coating in use, which manifests as crater wear in particular.

Problem of the Invention

The purpose of the invention is to prevent the disadvantages of the state of the art and especially to improve the tool life of coated tools, like chip removal tools, for example, cutting and forming tools and components for machinery and forming. It is also the problem of the invention to provide a method of cutting such coatings, especially cutting such coatings on sawn workpieces.

Solution or Path to Solution

The invention describes a special multi-layer design for a coating to prevent the coating from disintegrating too fast (wearing out) during use. The multi-layer design prevents or at least delays the disintegration and subsequent diffusion of the Cr—N portion in the AlCrN coating at high temperatures.

An RCS-type industrial coating system from the Balzer Company is used for the deposition of the Al—Cr—(X)—N/Ti—Si—N hard layers, as described, for example, in EP 1186681 in FIGS. 3 to 6 and the Description, column 7, line 18 to column 9, line 25. For this, the cleaned workpieces, depending on their diameter, attached to two or, for diameters smaller than 50 mm, to three rotating substrate holders and two Ti—Si targets produced by fusion metallurgy and four targets made of Al—Cr—(X) alloys produced by powder metallurgy are installed in six cathode arc sources placed on the walls of the coating system. The geometry of the target layout is basically determined by the octagonal plot of the RCS system, in which two heating segments arranged opposite each other separate two groups of three segments in a row with an arc cathode. For these experiments, an SiTi target was installed in the opposite middle element of each group of three. But other target layouts are also possible to produce such layers. In principle, such layers can be deposited in each system that has at least two arc cathodes in a geometrically equivalent position, for example at the same coating height of one or more rotating substrate holders. An expert knows it is possible to further influence the thickness of the individual layers or laminates by arranging the target or setting the respective substrate movement or rotation or the angular speed of rotation of a workpiece, depending on the type of system.

Next, the workpieces are brought to a temperature of approximately 500° C. by radiational heating also placed in the system and then the surface undergoes etch cleaning by Ar ions by applying a DC bias voltage of −100 to −200 V in an Ar atmosphere at a pressure of 0.2 Pa.

After that, an Al—Cr—N adhesive layer approximately 0.2 μm thick is deposited by operating four Al—Cr sources with a capacity of 3 kW and applying a substrate bias of −50 V for a period of approximately 5 minutes. Then, a multilayer coating is purposely created, in which first 2 Ti—Si sources also with 3 kW are connected to the 4 Al—Cr sources, and they are operated together for a period of approximately 1 minute. Then the 4 Al—Cr sources are turned off and a pure Ti—Si—N coating is deposited for approximately 3 minutes. Then the 4 Al—Cr sources are connected to it again for approximately 1 minute. After that, the TiSi sources are turned off, and a pure Al—Cr—N coating is deposited for another 5 minutes. This sequence for the layer stack is followed several times during the deposition in the invention.

Finally, another cover layer approximately 0.5 µm thick is applied, which was produced exclusively with the Ti—Si sources. Alternately, a thicker AlCrN cover layer can be applied here. All layers were deposited in an atmosphere of pure nitrogen at a pressure of around 3 pa and a negative substrate preliminary voltage of roughly 50 volts. Basically the process pressure in each of these steps can be set in a range from 0.5 to around 8 pa, but preferably between 0.8 and 5 Pa, whereby the atmosphere can be either pure nitrogen or a mixture of nitrogen and an inert gas, like argon, for nitride layers, or a mixture of nitrogen and a gas containing carbon, which can be mixed with an inert gas if necessary can be used for carbonitride layers. Accordingly, oxygen or a gas containing boron can be mixed in, as is known, for the deposition of layers containing oxygen or boron.

Table 1 shows the composition of the target, the crystal structure of the layer and the adhesion. Table 2 summarizes the process parameters, such as the target capacity, negative substrate preliminary voltage, process pressure and temperature.

According to the invention, workpieces are distinguished by the fact that a cubic $(Al_yCr_{1-y})X$ layer is deposited with X=N or CN, but preferably N, and $0.2 \leq y \leq 0.7$, preferably $0.3 \leq y \leq 0.5$ alternating with a cubic $(Ti_zSi_{1-z})X$ layer with X=N or CN, but preferably N, and $0.99 \geq z \geq 0.7$, preferably $0.97 \geq z \geq 0.85$ (see FIG. 1a), whereby at least one layer stack and at least one additional $(Al_yCr_{1-y})X$ or $(Ti_zSi_{1-z})X$ layer is applied. The structure of the layers is microcrystalline in both layers with an average grain size of approx. 5-150 nm, but preferably from approximately 10-120 nm. One advantage of the coating is the additional intermediate layers between the pure $(Al_yCr_{1-y})X$ and $(Ti_zSi_{1-z})X$ layers, in which all coating sources run and thus an $(Al_yCr_{1-y}Ti_zSi_{1-z})X$ layer is deposited (see FIG. 1b). These intermediate layers can, if necessary, depending on the sequence or composition and properties of the individual layer systems, bring about improved adhesion between the individual layers. Due to the geometric target arrangement within the coating system, because of the rotation of the workpiece during the deposition of this intermediate layer, a multilayer structure with very fine layers is also deposited, since as before individual Al—Cr-based and Ti—Si-based targets are used for the coating. The width of the individual layers within this intermediate layer is in the range of several nanometers.

Another way of designing the desired multilayer system, can be by periodically turning the coating sources on and off similarly to FIG. 1c. Here, the coating sources for a coating material run during the whole deposition process, while the coating sources with the second coating material are switched on periodically. In this case, an additional multilayer structure, as mentioned above, can be produced while the arc sources operate together.

The method in the invention is characterized by the fact that a process is chosen in order to deposit the layer stack described above. The multilayer structure is achieved by purposely turning the coating sources on and off. The multilayer substructure is maintained in addition by rotating or moving the workpieces being coated within the coating system.

Example 1 describes coatings with a defined number of layers or packets of layers, whereby a layer stack consists of a sequence of AlCrTiSiN layers followed by a layer of TiSiN, AlCrTiSiN and AlCrN. It is easy to see that compared to the layer tested in Experiment No. 1, which was deposited according to the state of the art, an improvement in tool life can be achieved with the coating in the invention. It is also clear that the optimal layer thickness of the individual layers made of $Al_yCr_{1-y}N$ and $Ti_zSi_{1-z}N$ is important for the necessary increase in tool life. This layer thickness for $Al_yCr_{1-y}N$ is between 75 nm and 200 nm, preferably 120 nm to 170 nm, and for $Ti_zSi_{1-z}N$ between 50 and 150 nm, preferably between 70 to 120 nm. In this example, these layer thicknesses were altered over the coating time so that for all experiments, a comparable layer thickness of roughly 4 µm could be achieved. For these experiments, a layer design was chosen like the one described in FIG. 1b. The layers, in which all coating sources were used, were not changed for the respective experiments and yielded an individual layer thickness of around 20±10 nm, respectively.

Basically, completely different workpieces can be coated advantageously with these kinds of $Al_yCr_{1-y}N/Ti_zSi_{1-z}N$ multilayer coatings. Examples of this are cutting tools like milling cutters, hob cutters, spherical head cutters, planar and profile cutters and drills, taps, shaving dies, reamers and indexable inserts for lathe and mill work and forming tools like stamps, dies, drawing dies, knockout cores or thread formers. Also injection-molding tools, for example for metal injection-molding alloys, synthetic resins or thermoplastics, especially injection-molding tools like those used for producing plastic molded parts or data carriers like CDs, DVDs et al., can be protected advantageously with such layers. Although better results are not always achieved by the coatings in the inventions for all applications on different tools, much higher wear resistance can be achieved, at least on certain applications and in the examples listed than with the coatings known in the past.

In addition, because of the behavior of $Al_yCr_{1-y}N/Ti_zSi_{1-z}X$ multilayer coatings, which is similar in principle, an improvement in wear behavior can be expected when target compositions and coating parameters in the following layer systems are chosen so that X=N, C, B, CN, BN, CBN, NO, CO, BO, CNO, BNO and CBNO, but preferably N and CN and $0.2 \leq y \leq 0.7$, preferably $0.40 \leq y \leq 0.68$ and $0.99 \geq z \geq 0.7$, preferably $0.95 \geq z \geq 0.85$.

One way of improving the coating properties of $Al_yCr_{1-y}N/Ti_zSi_{1-z}N$ multilayer coatings consists of alloying other chemical elements from one or more groups of Groups IVb, Vb and/or VIb of the Periodic Table of the Elements, or silicon. It can be especially advantageous to alloy with the layer stack of the $Al_yCr_{1-y-m}M_mN$ layer, with $0 \leq m \leq 0.25$, preferably with $0 \leq m \leq 0.15$. The elements for M=W, V, Mo, Nb and Si have proven particularly advantageous (see Example No. 5).

Another way of improving the properties of the layer system is to put an extra sliding layer on the layer stack or on the cover layer closing the hard coating on the outside. The sliding coating system can be made of at least one metal or a carbide of at least one metal and disperse carbon, MeC/C, whereby the metal is a metal from the Group IVb, Vb and/or VIb and/or silicon. For example, a WC/C cover layer with a hardness that can be set between 1000 and 1500 HV that has excellent intake properties is especially suitable for this. CrC/C coatings also have similar behavior with a somewhat higher friction coefficient.

With such coated deep-hole drills, after a bore hole was produced, it was possible to detect additional intake smoothness of the chip surfaces, which has only been achieved to date by expensive mechanical machining. This results in an improvement in chip transport along the chip groove and minimization of friction torque during the drilling process. Such properties are also of interest particularly for component applications with sliding, rubbing or rolling stresses, especially when there is a lack of lubrication or when they run dry, or if an uncoated counter body must be protected at the same time. Other ways of making a sealing sliding coating are metal-free diamond-like carbon coatings, or $MoS_x$, $WS_x$ or $MoS_x$ or $MoW_x$ layers containing titanium.

The sliding layer can be applied, as mentioned, directly to the multilayer system or after another adhesive layer is applied, in order to achieve the best possible adhesion of the layer composite. The adhesive layer can be designed to be made of metal, nitride, carbide, carbonitride or as a gradient layer.

For example, WC/C or CrC/C layers can be produced, after applying a sputtered or arced Cr or Ti adhesive layer, advantageously by sputtering a WC target while adding a gas containing carbon. Here, the percentage of gas containing carbon is increased over time to achieve a larger percentage of free carbon in the layer.

OTHER ADVANTAGEOUS EFFECTS OF THE INVENTION

The following will show advantageous applications of the invention, as examples, using different cutting operations.

EXAMPLE 1

Drills with Inner-Cooled HM Drill Bits of Structural Steel

| Tool: | Hard metal drill with cooling ducts |
| --- | --- |
| | Diameter D = 6.8 mm |
| Workpiece: | Structural steel DIN 1.1191 (Ck45) |
| Drilling parameters: | Cutting speed $v_c$ = 120 m/min |
| | Tooth feed $f_z$ = 0.2 mm/rotation |
| | Hole depth z = 34 mm (5 × D) |
| Cooling: | 5% emulsion |
| Process: | blind hole |
| Wear criterion: | Corner wear VB = 0.2 mm |

| Experiment No. | Layer thickness [μm] | Tool life expressed in units of length of path traversed** [m] |
| --- | --- | --- |
| 1 AlCrN + TiSiN | 3.9 | 54.3 |
| 2 AlCrN + 2 × layer stack 1* + TiSiN | 4.2 | 43.9 |
| 3 AlCrN + 4 × layer stack 1* + TiSiN | 3.9 | 65.2 |
| 4 AlCrN + 8 × layer stack 1* + TiSiN | 4.0 | 76.2 |
| 5 AlCrN + 12 × layer stack 1* + TiSiN | 4.0 | 54.3 |
| 6 AlCrN + 15 × layer stack 1* + TiSiN | 3.9 | 43.9 |

*A (1×) coating stack corresponds to a one-time sequence of "AlCrTiSiN + TiSiN + AlCrTiSiN + AlCrN."
**In which the width of the wear land was VB = 0.2 mm.

Example 1 shows a comparison of the tool lives of coated HM drills, in which a different number of coating stacks were applied with the same adhesive layer, namely AlCrN and a cover layer, namely TiSiN. The coating time of the TiSiN and AlCrN layers was adjusted so that in the end, the total thicknesses of the layers were comparable. An optimum total tool life was found in Experiment No. 4 with a total number of 37 layers, which shows a clear improvement over the state of the art from Experiment No. 1.

EXAMPLE 2

Drills with Inner-Cooled HM Drills of Structural Steel

| Tool: | Hard metal drill with cooling ducts |
| --- | --- |
| | Diameter D = 6.8 mm |
| Workpiece: | Structural steel DIN 1.1191 (Ck45) |
| Drilling parameters: | Cutting speed $v_c$ = 120 m/min. |
| | Tooth feed $f_z$ = 0.2 mm/rotation |
| | Hole depth z = 34 mm (5 × D) |
| Cooling: | 5% emulsion |
| Process: | Blind hole |
| Wear criterion: | Corner wear VB = 0.2 mm |

| Experiment No. | Tool life expressed in length of path traversed with VB = 0.2 mm in meters |
| --- | --- |
| 6 (TiAlN/TiN multilayer) | 32.3 |
| 8 (TiAlN monolayer) | 32.3 |
| 9 (AlCrN monolayer) | 65.9 |
| 10 AlCrN + 8 × layer stack 1* + TiSiN | 76.2 |

Example 2 shows a comparison of the tool lives of coated HM drill bits. Here, an improvement in tool life was also able to be achieved with the AlCrN/TiSiN multilayer compared to hard coatings of TiAlN/TiN multilayer and TiAlN monolayer coatings used industrially.

EXAMPLE 3

Drills with Outer-Cooled HM Drill Bits of Structural Steel

| Tool: | Hard metal drill with cooling ducts |
| --- | --- |
| | Diameter D = 6.8 mm |
| Workpiece: | Structural steel DIN 1.1191 (Ck45) |
| Drilling parameters: | Cutting speed $v_c$ = 120 m/min. |
| | Tooth feed $f_z$ = 0.2 mm/rotation |
| | Hole depth z = 23.8 mm (3.5 × D) |
| Cooling: | 5% emulsion |
| Process: | Blind hole |
| Wear criterion: | Corner wear VB = 0.15 mm |

| Experiment No. | Tool life expressed in length of path traversed with VB = 0.15 mm in meters |
| --- | --- |
| 11 (TiAlN/TiN multilayer) | 46.1 |
| 12 (TiAlN monolayer) | 42.3 |
| 13 (AlCrN monolayer) | 22.6 |
| 14 AlCrN + 8 × layer stack 1* + TiSiN | 61.5 |

Example 3 shows a comparison of the tool lives of coated HM drill bits. Here, an improvement in tool life was also able to be achieved with the AlCrN/TiSiN multilayer compared to hard TiAlN-based coatings used industrially.

EXAMPLE 4

Drills with Inner-Cooled HM Drill Bits of Cast Iron (GGG-50)

| Tool: | Hard metal drill with cooling ducts Diameter D = 6.8 mm |
|---|---|
| Workpiece: | Cast iron with spherical graphite GGG50 |
| Drilling parameters: | Cutting speed $v_c$ = 200 m/min. |
| | Tooth feed $f_z$ = 0.3 mm/rotation |
| | Hole depth z = 34 mm (5 × D) |
| Cooling: | 5% emulsion |
| Process: | Blind hole |
| Wear criterion: | Corner wear VB = 0.1 mm |

| Experiment No. | Tool life expressed in length of path traversed with VB = 0.1 mm in meters |
|---|---|
| 15 (TiAlN/TiN multilayer) | 57.1 |
| 16 (TiAlN monolayer) | 142.8 |
| 17 (AlCrN monolayer) | 185.6 |
| 18 AlCrN + 8 × layer stack 1* + TiSiN | 199.9 |

Example 4 shows a comparison of the tool lives of coated HM drill bits. Here, an improvement in tool life was also able to be achieved with the AlCrN/TiSiN multilayer coating compared to hard layers of TiAlN/TiN multilayer coating and TiAlN monolayer coatings used industrially.

EXAMPLE 5

Drills with Inner-Cooled HM Drill Bits of Structural Steel

| Tool: | Hard metal drill with cooling ducts Diameter D = 6.8 mm |
|---|---|
| Workpiece: | Structural Steel DIN 1.1191 (Ck45) |
| Drilling parameters: | Cutting speed $v_c$ = 120 m/min. |
| | Tooth feed $f_z$ = 0.2 mm/rotation |
| | Hole depth z = 34 mm (5 × D) |
| Cooling: | 5% emulsion |
| Process: | Blind hole |
| Wear criterion: | Corner wear VB = 0.2 mm |

| Experiment No. | Al at % | Cr at % | M at % | Layer thickness [μm] | Tool life expressed in length of path traversed with VB = 0.2 mm in meters |
|---|---|---|---|---|---|
| 19 AlCrWN + 8 × layer stack 2* + TiSiN | 70 | 28 | 2 | 3.8 | 65.8 |
| 20 AlCrWN + 8 × layer stack 2* + TiSiN | 70 | 25 | 5 | 3.4 | 59.3 |
| 21 AlCrNbN + 8 × layer stack 2* + TiSiN | 70 | 25 | 5 | 3.8 | 57.8 |
| 22 AlCrMoN + 8 × layer stack 2* + TiSiN | 70 | 25 | 5 | 4.8 | 61.2 |
| 23 AlCrVN + 8 × layer stack 2* + TiSiN | 70 | 25 | 5 | 4.2 | 68.0 |
| 24 AlCrSiN + 8 × layer stack 2* + TiSiN | 70 | 25 | 5 | 4.0 | 54.4 |

*A (1×) layer stack 2* corresponds to a one-time coating sequence of "AlCrMTiSiN + TiSiN + AlCrMTiSiN + AlCrMN," wherein M stands for one of the elements W, Nb, Mo V or Si.

Example 5 shows a comparison of the tool lives of HM drills coated according to the invention on which multilayer systems with different chemical compositions, but the same cover layer (TiSiN) were deposited. As a chemical composition, the target composition was varied, wherein Al was kept constant, and Cr was partly replaced by a third element. The process parameters for layer deposition were kept equal as in the other experiments.

Another way of producing a corresponding layer stack is when, as in FIG. 1c, either the AlCr or AlCrM sources or the TiSi source or sources are operated constantly and the other source or sources are turned on as needed. In particular with constant operation of the above-mentioned 4 AlCr or AlCrM sources, the deposition rate can be increased, and the following layer system can be deposited, for example:

one (AlCrTiSi)X mixed layer
followed by another $(Al_yCr_{1-y})$X layer
followed by another (AlCrTiSi)X mixed layer
followed by another $(Al_yCr_{1-y})$X layer.

DESCRIPTION OF FIGURES

FIGS. 1 a-c discuss three variations of how a multilayer coating can be made.

FIG. 1a shows a sequence of layers with sharp transitions. A layer system (2) is deposited directly on a second layer system (1). This process is repeated until the desired total layer thickness is reached. A cover layer (3) with higher thicknesses can be deposited as the last layer.

In FIG. 1b, mixed layers (4) in which both layer systems are applied simultaneously are deposited between the individual layers. The mixed layer can be made either thin as a sliding transitional layer or thicker with an area where the composition of the layer is constant. Such a layer can have the following composition, for example: Al=40.7 at %, Cr=21.2 at %, Ti=32.8 at % and Si=5.3 at %. This composition comes about when AlCr targets with a composition of Al=70 at % and Cr=30 at % and TiSi targets with a composition of Ti=85 at % and Si=15 at % are used simultaneously. In general, the composition of a mixed layer with a constant composition is advantageously set in the following range:

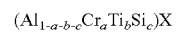

$$(Al_{1-a-b-c}Cr_aTi_bSi_c)X$$

where $0.18 \leq a \leq 0.48$; $0.28 \leq b \leq 0.4$; $0.004 \leq c \leq 0.12$. The aluminum content is advantageously kept at over 10 at %. If other elements are added, as mentioned above, to achieve a corresponding effect, depending on the element, a minimum concentration of 0.5 to 1 atom percentage and a maximum concentration of 15% to 25% are added.

In FIG. 1c, a multilayer coating is deposited by applying a layer system (5) during the whole coating time, and the second layer system is periodically mixed in with it by turning on the corresponding coating source.

Figure 1:
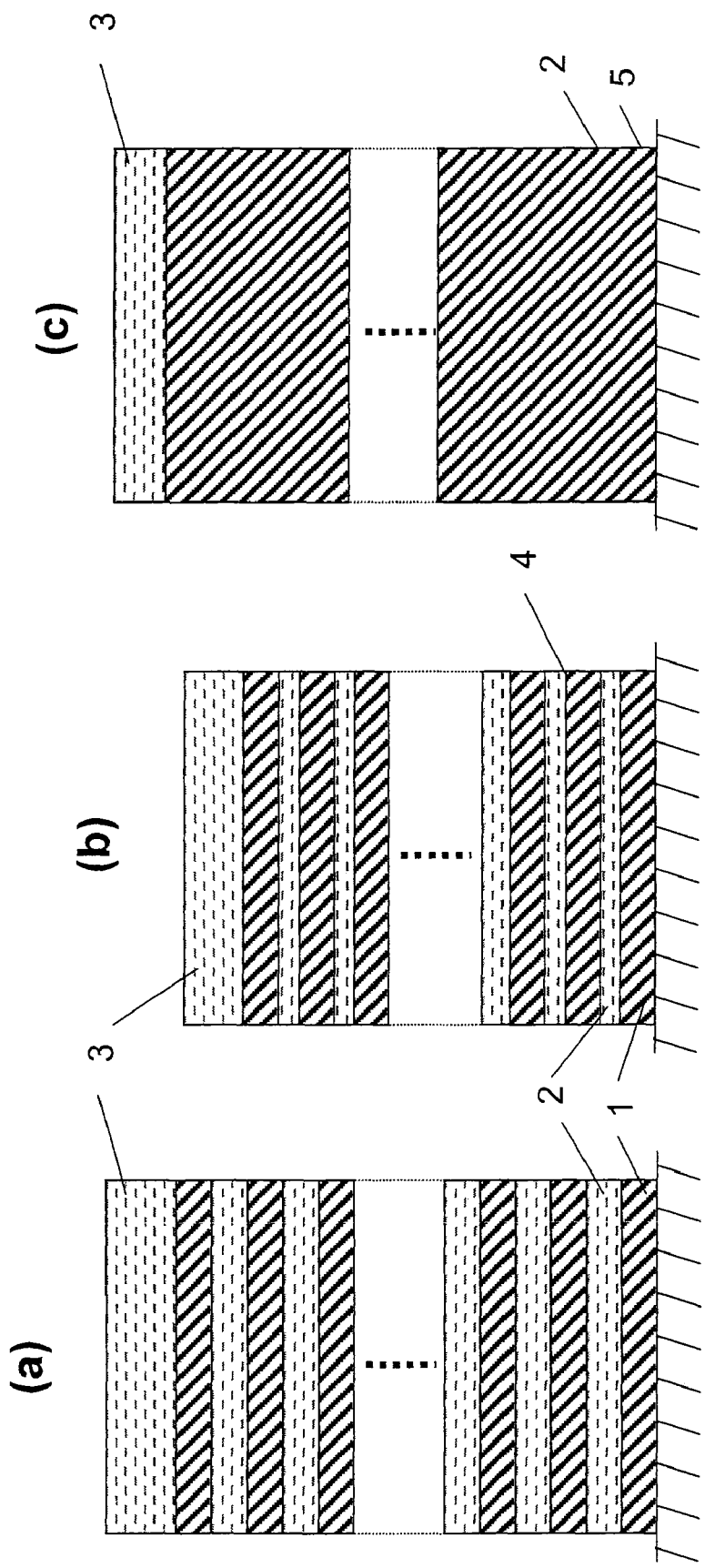
FIG. 1 shows different layer variations.
Figure 2:
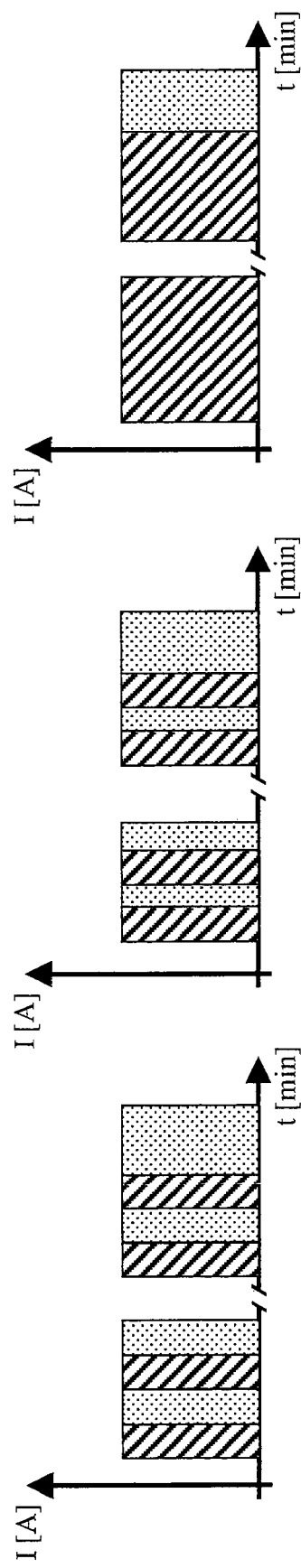

FIG. 2 shows the design of the layer packet in FIG. 1 in an altered view.

TABLE 1

| | | Composition of Target | | | | | |
|---|---|---|---|---|---|---|---|
| | | Target 1 | | | Target 2 | Layer Thickness | |
| Experiment | Crystal Structure | Al at % | Cr at % | M at % | Ti at % | Si at % | [μm] | Adhesion |
| A | B1 | 70 | 30 | — | 85 | 15 | 4.0 | HF1 |
| B | B1 | 70 | 28 | W = 2 | 85 | 15 | 3.8 | HF1 |
| C | B1 | 70 | 25 | 2 = 5 | 85 | 15 | 3.4 | HF1 |
| D | B1 | 70 | 25 | Nb = 5 | 85 | 15 | 3.8 | HF1 |
| E | B1 | 70 | 25 | V = 5 | 85 | 15 | 4.8 | HF1 |
| F | B1 | 70 | 25 | Mo = 5 | 85 | 15 | 4.2 | HF1 |
| G | B1 | 70 | 25 | Si = 5 | 85 | 15 | 4.0 | HF1 |

TABLE 2

| Experiment | $P_{Target}$Al—Cr-M [kW] | $P_{Target}$Ti—Si [kW] | $U_{Substrate}$ [V] | $P_{N2}$ [Pa] | Temp. [° C.] |
|---|---|---|---|---|---|
| A | 3 | 3 | −50 | 3 | 500 |
| B | 3 | 3 | −50 | 3 | 500 |
| C | 3 | 3 | −50 | 3 | 500 |
| D | 3 | 3 | −50 | 3 | 500 |
| E | 3 | 3 | −50 | 3 | 500 |
| F | 3 | 3 | −50 | 3 | 500 |
| G | 3 | 3 | −50 | 3 | 500 |

The invention claimed is:

1. A method of providing a hard coating on a workpiece, comprising:
  a) positioning the workpiece in a coating system adjacent at least one TiSiX target and at least one AlCrX target, each of said targets having an associated cathodic arc source, wherein X is selected from the group consisting of N, C, B, CN, BN, CBN, NO, CO, BO, CNO, BNO, and CBNO;
  b) rotating the workpiece;
  c) applying a biasing voltage to said workpiece; and
  d) selective operating said cathodic arc sources to deposit a multilayer coating onto the workpiece, said multilayer coating comprising:
  at least one layer selected from the group consisting of:
    an $(Al_yCr_{1-y})X$ layer, wherein $0.2 \leq y \leq 0.7$ and X is selected from the group consisting of N, C, B, CN, BN, CBN, NO, CO, BO, CNO, BNO, and CBNO, and
    a $(Ti_zSi_{1-z})X$ layer, wherein $0.99 \geq z \geq 0.7$, and
  at least one layer stack comprising the following layers:
    one (AlCrTiSi)X mixed layer
    followed by another $(Ti_zSi_{1-z})X$ layer
    followed by another (AlCrTiSi)X mixed layer
    followed by another $(Al_yCr_{1-y})X$ layer,
    wherein X, y and z are as previously defined.

2. The method of claim 1, said coating system comprising six cathodic arc sources, two TiSi targets being associated with two of said cathodic arc sources, and four AlCrX targets being associated with the remaining four of said arc sources, said arc sources and targets being arranged in a patter around the workpiece with the workpiece disposed in the center.

3. The method of claim 1, said workpiece being brought to a temperature of approximately 500° C. and its surface cleaned by bombardment of Ar ions in an Ar atmosphere at a pressure of 0.2 Pa prior to said step (d).

4. The method of claim 1, said step (d) being carried out under an inert atmosphere at a pressure of 0.5 to 8 Pa.

5. The method of claim 4, said inert atmosphere comprising an inert gas that is selected to correspond to the composition of the layer being applied to the workpiece at a given time.

6. The method of claim 1, wherein the following deposition steps are carried out in sequence to deposit successive layers onto said workpiece:
  i) deposition of an AlCrX adhesive layer having a thickness of approximately 0.2 microns;
  ii) operating the cathodic arc sources associated with all of said targets together to deposit a mixed AlCrX/TiSiX layer;
  iii) turning off only the cathodic arc sources associated with said at least one AlCrX target to deposit a pure TiSiX layer;
  iv) reactivating the cathodic arc sources associated with said at least one AlCrX target to again deposit a mixed AlCrX/TiSiX layer; and
  v) turning off the cathodic arc sources associated with said at least one TiSi target to deposit a pure AlCrX layer.

7. The method of claim 6, said steps (i)-(v) being repeated in sequence to deposit a plurality of stacks of said successive layers onto said workpiece.

8. The method of claim 7, wherein after said plurality of stacks have been deposited, a pure TiSiX layer having a thickness of approximately 0.5 microns is deposited thereover.

9. The method of claim 6, wherein X=N.

10. The method of claim 1, characterized by the fact that the at least one $(Al_yCr_{1-y})X$ layer, the other $(Al_yCr_{1-y})X$ layer and the (AlCrTiSi)X mixed layers contain at least one other element from Group IVb, Vb and/or VIb of the Periodic Table of the Elements, or silicon.

11. The method of claim 10, characterized by the fact that the at least one $(Al_yCr_{1-y})X$ layer and the other $(Al_yCr_{1-y})X$ layer contain 0.5 to 25 atom % of the other element or silicon, setting the concentration of the elements and of the silicon in the other (AlCrTiSi) X mixed layers.

12. The method of claim 1, characterized by the fact that layers in the layer stack have the following thickness:
  $Al_yCr_{1-y}N$ layer between 75 nm and 200 nm
  $Ti_zSi_{1-z}N$ layer between 50 and 150 nm
  (AlCrTiSi)X mixed layer 20±10 nm.

13. The method of claim 1, characterized by the fact that the coating includes several layer stacks in a row.

14. The method of claim 13, characterized by the fact that the coating contains 4, 8 or 12 layer stacks.

15. The method of claim 1, characterized by the fact that at least one $(Al_yCr_{1-y})X$ layer is deposited directly on the workpiece or on an adhesive layer.

16. The method of claim 1, characterized by the fact that a $(Al_yCr_{1-y})X$ cover layer or a $(Ti_zSi_{1-z})X$ layer forms the outer last layer of the hard coating.

17. The method of 1, characterized by the fact that an additional sliding layer is deposited on the hard coating.

18. A method of providing a hard coating on a workpiece, comprising:
   a) positioning the workpiece in a coating system adjacent at least one TiSiX target and at least one AlCrX target, each of said targets having an associated cathodic arc source, wherein X is selected from the group consisting of N, C, B, CN, BN, CBN, NO, CO, BO, CNO, BNO, and CBNO;
   b) rotating the workpiece;
   c) applying a biasing voltage to said workpiece; and
   d) selective operating said cathodic arc sources to deposit a multilayer coating onto the workpiece, said multilayer coating comprising:
      at least one layer selected from the group consisting of:
         an $(Al_yCr_{1-y})X$ layer, wherein $0.2 \leq y \leq 0.7$ and X is selected from the group consisting of N, C, B, CN, BN, CBN, NO, CO, BO, CNO, BNO, and CBNO, and
         a $(Ti_zSi_{1-z})X$ layer, wherein $0.99 \geq z \geq 0.7$, and
      at least one layer stack comprising the following layers:
         one (AlCrTiSi)X mixed layer
         followed by another $(Al_yCr_{1-y})X$ layer
         followed by another (AlCrTiSi)X mixed layer
         followed by another $(Al_yCr_{1-y})X$ layer,
         wherein X, y and z are as previously defined.

19. The method of claim 1, said workpiece comprising by the fact that the workpiece is tool for machining, forming or cutting.

20. The method of claim 1, said workpiece being a drill.

21. The method of claim 11, wherein X is selected from the group consisting of N and CN.

22. The method of claim 1, wherein:
X in said at least one layer is N or CN,
X in said $(Ti_zSi_{1-z})X$ layer is N or CN, and
$0.95 \geq z \geq 0.85$.

23. The method of claim 1, wherein X is N or CN in every recited layer.

24. The method of claim 1, wherein $0.3 \leq y \leq 0.5$ and $0.97 \geq z \geq 0.85$.

* * * * *